United States Patent
Alford et al.

(10) Patent No.: US 9,559,249 B2
(45) Date of Patent: Jan. 31, 2017

(54) MICROWAVE-ANNEALED INDIUM GALLIUM ZINC OXIDE FILMS AND METHODS OF MAKING THE SAME

(71) Applicant: Arizona Board of Regents on Behalf of Arizona State University, Scottsdale, AZ (US)

(72) Inventors: Terry L. Alford, Tempe, AZ (US); Aritra Dhar, Tempe, AZ (US)

(73) Assignee: Arizona Board of Regents, Scottsdale, AZ (US), on behalf of Arizona State University ( * ) Notice: Subject to any disclaimer, the term of this patent is extended or adjusted under 35 U.S.C. 154(b) by 0 days.

(21) Appl. No.: 14/806,050

(22) Filed: Jul. 22, 2015

(65) Prior Publication Data

US 2016/0027955 A1   Jan. 28, 2016

Related U.S. Application Data

(60) Provisional application No. 62/027,614, filed on Jul. 22, 2014.

(51) Int. Cl.
| | |
|---|---|
| *H01L 29/12* | (2006.01) |
| *H01L 21/00* | (2006.01) |
| *H01L 31/18* | (2006.01) |
| *H01L 31/0224* | (2006.01) |
| *H01L 51/52* | (2006.01) |
| *H01L 51/44* | (2006.01) |

(52) U.S. Cl.
CPC ... *H01L 31/1884* (2013.01); *H01L 31/022483* (2013.01); *H01L 51/442* (2013.01); *H01L 51/5206* (2013.01); *H01L 2251/308* (2013.01); *H01L 2933/0016* (2013.01); *Y02P 70/521* (2015.11)

(58) Field of Classification Search
CPC .............. H01L 31/022483; H01L 31/1884; H01L 51/5206; H01L 51/442
USPC ............................................ 257/43; 438/104
See application file for complete search history.

(56) References Cited

U.S. PATENT DOCUMENTS

| | | |
|---|---|---|
| 4,490,183 A | 12/1984 | Scovell |
| 4,931,424 A | 6/1990 | Henty |
| 5,082,688 A | 1/1992 | Agostinelli et al. |
| 5,288,456 A | 2/1994 | Aboelfotoh et al. |
| 5,443,863 A | 8/1995 | Neely et al. |
| 5,707,466 A | 1/1998 | Atwater et al. |
| 5,855,993 A | 1/1999 | Brady et al. |
| 6,046,108 A | 4/2000 | Liu et al. |

(Continued)

FOREIGN PATENT DOCUMENTS

EP   0472804 B1   7/1997

OTHER PUBLICATIONS

Aboelfotoh et al., Novel low-resistance ohmic contact to n-type GaAs using Cu3Ge, Appl. Phys. Lett., vol. 65, No. 25, 1994, pp. 3245-3247.

(Continued)

*Primary Examiner* — Luan C Thai
(74) *Attorney, Agent, or Firm* — Quarles & Brady LLP (57) ABSTRACT

A microwave-annealed indium gallium zinc oxide (IGZO) film and methods of making the same are disclosed. The methods may comprise: depositing an IGZO film onto a substrate; and microwave annealing the IGZO film to produce a microwave-annealed IGZO film.

20 Claims, 7 Drawing Sheets

(56) References Cited

U.S. PATENT DOCUMENTS

| | | | |
|---|---|---|---|
| 6,172,322 | B1 | 1/2001 | Shang et al. |
| 6,183,689 | B1 | 2/2001 | Roy et al. |
| 6,821,890 | B2 | 11/2004 | McGahay et al. |
| 7,901,609 | B2 | 3/2011 | Xiong et al. |
| 8,257,995 | B2 | 9/2012 | Hilali et al. |
| 8,940,578 | B2 * | 1/2015 | Facchetti ............ C23C 18/1216 257/43 |
| 2009/0134521 | A1 | 5/2009 | Liu et al. |
| 2010/0151130 | A1 | 6/2010 | Ammerlaan et al. |
| 2010/0206720 | A1 | 8/2010 | Lin et al. |
| 2014/0272396 | A1 | 9/2014 | Alford et al. |

OTHER PUBLICATIONS

Bale et al., FactSage Thermochemical Software and Databases, Calphad, vol. 26, No. 2, 2002, pp. 189-228.

Barmak et al., Texture of Cu and dilute binary Cu-alloy films: impact of annealing and solute content, Mater. Sci. Semi. Proc., vol. 6, 2003, pp. 175-184.

Blobaum et al., Sputter-deposition and characterization of paramelaconite, J. Mater. Res., vol. 18, No. 7, 2003, pp. 1535-1542.

Borek et al., Low resistivity copper germanide on (100) Si for contacts and interconnections, Appl. Phys. Lett., vol. 69, No. 23, 1996, pp. 3560-3562.

Caspi et al., Pressure effect on the magnetic and crystallographic structures in the U(Ni1-xCux)2Ge2 system, J. Alloys Compounds, 271-273, 1998, pp. 378-381.

Das et al., Microwave assisted low temperature encapsulation of Ag films by Cu reactions using Ag—Cu alloy structures, Mater. Lett., vol. 89, 2012, pp. 163-165.

Das et al., Structural and optical properties of Ag-doped copper oxide thin films on polyethylene napthalate substrate prepared by low temperature microwave annealing, J. Appl. Phys., vol. 113, 244905, 2013, pp. 1-6.

Dhar et al., Room-temperature synthesis of copper germanide phase by ion beam mixing, Appl. Phys. Lett., vol. 67, No. 12, 1995, pp. 1700-1702.

Doolittle, Algorithms for the rapid simulation of Rutherford backscattering spectra, Nuc. Inst. Meth. Phys. Res., vol. 89, 1985, pp. 344-351.

Erofeev et al., A gold free fully Cu/Ge metalized GaAs pHEMT for the high frequency applications, IEEE International Siberian Conference on Control and Communications (SIBCON), 2011, pp. 261-264.

Gaudet et al., Thin film reaction of transition metals with germanium, J. Vac. Sci. Technol. A, vol. 24, No. 3, 2006, pp. 474-485.

Goel et al., Substitution site effect on structural and dielectric properties of La—Bi modified PZT, J. Mater. Sci., vol. 42, 2007, pp. 3928-3935.

Han et al., Improved surface morphology and texture of Ag films on indium tin oxide via Cu additions, J. Appl. Phys., vol. 102, 2007, pp. 036101-1 thru 036101-3.

Her et al., Phase transformation and crystallization kinetics of a-Ge/Cu bilayer for blue-ray recording under thermal annealing and pulsed laser irradiation, J. Appl. Phys., vol. 111, 2012, pp. 043503-1 thru 043503-6.

Huang et al., Influence of Ag doped CuO nanosheet arrays on electrochemical behaviors for supercapacitors, Electrochimica Acta, vol. 75, 2012, pp. 208-212.

Indluru et al., Effect of Ag thickness on electrical transport and optical properties of indium tin oxide-Ag-indium tin oxide multilayers, J. Appl. Phys., vol. 105, 2009, pp. 123528-1 thru 123528-9.

Ishihara et al., Preparation of CuO thin films on porous BaTiO3 by self-assembled multibilayer film formation and application as a CO2 sensor, J. Mater. Chem., vol. 8, No. 9, 1998, pp. 2037-2042.

Joi et al., Pulse plating of copper germanide, Appl. Phys. Lett., vol. 102, 2013, 134107-1 thru 134107-4.

Krusin-Elbaum et al., Unusually low resistivity of copper germanide thin films formed at low temperatures, Appl. Phys. Lett. vol. 58, No. 12, 1991, pp. 1341-1343.

Lee et al., Copper oxide reduction through vacuum annealing, Appl. Surf. Sci., vol. 206, 2003, pp. 102-109.

Li et al., Role of Surface/Interfacial Cu2+ Sites in the Photocatalytic Activity of Coupled CuO—TiO2 Nanocomposites, J. Phys. Chem. C, vol. 112, 2008, pp. 19040-19044.

Liou et al., Oxidation of Cu and Cu3Ge thin films, J. Appl. Phys., vol. 77, No. 10, 1995, pp. 5443-5445.

Marabelli et al., Optical gap of CuO, Physical Review B, vol. 52, No. 3, 1995, pp. 1433-1436.

Maruyama, Copper oxide thin films prepared by chemical vapor deposition from copper dipivaloylmethanate, Solar Energy Materials & Solar Cells, vol. 56, 1998, pp. 85-92.

Morgan et al., Sythesis of Paramelaconite: Cu4O3, J. Solid State Chem., vol. 121, 1996, pp. 33-37.

Peng et al., Functionalization of silver nanowire surfaces with copper oxide for surface-enhanced Raman spectroscopic bio-sensing, J. Mater. Chem. vol. 22, 2012, pp. 15495-15499.

Peter et al., Selective chemical vapor synthesis of Cu3Ge: Process optimization and film properties, Intermetallics, vol. 34, 2013, pp. 35-42.

Shirley, High-resolution X-ray photoemission spectrum of the valence bands of gold, Phys. Rev. B, vol. 5, No. 12, 1972, pp. 4709-4714.

Wang et al., Formation of aluminum oxynitride diffusion barriers for Ag metallization, Appl. Phys. Lett., vol. 74, No. 1, 1999, pp. 52-54.

Wang et al., Preparation and catalytic properties of Ag/CuO nanocomposites via a new method, Mater. Chem. Phys., vol. 108, 2008, pp. 165-169.

Reeja-Jayan et al., Microwave-assisted low-temperature growth of thin films in solution, Scientific Reports 2, 2012, pp. 1-8.

Meyer et al., Binary Copper Oxide Semiconductors: From Materials Towards Devices, Phys. Status Solidi B, vol. 249, No. 8, pp. 1487-1509 (2012).

Teng et al., Effects of microwave annealing on electrical enhancement of amorphous oxide semiconductor thin film transistor, Appl. Phys. Lett., 2012, vol. 101, pp. 132901-1 thru 132901-4.

Cheong et al., Characterization of an oxide semiconductor prepared by microwave sintering, Japanese Journal of Applied Physics 53, 2014, pp. 05HA12-1 thru 05HA12-4.

Gadre, Thermal Processing and Microwave Processing of Mixed-Oxide Thin Films, PhD Thesis, Arizona State University, Aug. 2011, 98 pages.

Granqvist et al., Transparent and conducting ITO films: new developments and applications, Thin Solid Films 411, 2002, pp. 1-5.

Guillen et al., ITO/metal/ITO multilayer structures based on Ag and Cu metal films for high-performance transparent electrodes, Solar Energy Materials & Solar Cells 92, 2008, pp. 938-941.

Guillen et al., TCO/metal/TCO structures for energy and flexible electronics, Thin Solid Films, 520, pp. 1-17 (2011).

Gustafsson et al., Flexible light-emitting diodes made from soluble conducting polymers, Nature, 357, pp. 477-479 (1992).

Gadre et al., Highest transmittance and high-mobility amorphous indium gallium zinc oxide films on flexible substrate by room-temperature deposition and post-deposition anneals, Applied Physics Letters, 99, No. 5 (2011), pp. 051901-1 thru 051901-3.

Hosono, Ionic amorphous oxide semiconductors: Material design, carrier transport, and device application, Journal of Non-Crystalline Solids 352, pp. 851-858 (2006).

Clark et al., Microwave Processing of Materials, Annu. Rev. Mater. Sci., 26, pp. 299-331 (1996).

Haacke, New figure of merit for transparent conductors, J. Appl. Phys. 47, pp. 4086-4089 (1976).

Das et al., Enhanced electrical performance of Ag—Cu thin films after low temperature microwave processing, J. Vac. Sci. Technol. B 31, 2013, pp. 011204-1 thru 011204-6.

Vemuri, Novel Low Temperature Processing for Enhanced Properties of Ion Implanted Thin Films and Amorphous Mixed Oxide Thin Film Transistors, PhD Thesis, Arizona State University, May 2013, 129 pages.

* cited by examiner

MICROWAVE-ANNEALED INDIUM GALLIUM ZINC OXIDE FILMS AND METHODS OF MAKING THE SAME

CROSS-REFERENCE TO RELATED APPLICATIONS

This application claims priority U.S. Provisional Patent Application No. 62/027,614, filed Jul. 22, 2014, the entire contents of which are hereby incorporated by reference.

STATEMENT REGARDING FEDERALLY SPONSORED RESEARCH

This invention was made with government support under DMR-0902277 awarded by the National Science Foundation. The government has certain rights in the invention.

BACKGROUND OF THE INVENTION

The invention relates generally to processing of semiconductors.

In recent years, transparent conductive oxides (TCOs) have attracted attention due to the high demand for optoelectronic devices such as solar cells, light emitting diodes (LEDs), and organic light-emitting diodes (OLEDs). Currently, indium tin oxide (ITO) is the most commonly used TCO material due to high electrical conductivity and high optical transparency in the visible region (~80%). However, ITO has several limitations. Notably, its transparency in the near-UV region decreases rapidly and there exists a low supply of indium. Hence, it makes the cost of ITO fabrication very high.

In contrast to the disadvantages of ITO, several investigations had been done one the zinc-oxide (ZnO)-based materials such as gallium zinc oxide (GZO), indium zinc oxide (IZO), aluminum zinc oxide (AZO), and indium gallium zinc oxide (IGZO). These compounds are better alternatives due to their low toxicity, high carrier mobility, excellent environmental stability and superior chemical selectivity. Among them, IGZO is a new prospective material used as TCO on optoelectronic devices due to its high transmittance, low processing temperature and excellent surface smoothness. However, the electrical resistivity of IGZO is still high for its application as transparent electrode. To decrease the electrical resistivity of IGZO, several studies have been conducted to investigate the relationship between stoichiometry and electrical properties or controlling deposition parameters. However, little attention has been paid to the influence of post-deposition processing parameters on optical and electrical properties of IGZO.

Consequently, considering such limitations of previous technological approaches, it would be desirable to have a system and method for making an IGZO thin film with improved optical and electrical properties with a reduced annealing time.

SUMMARY OF THE INVENTION

The present invention overcomes the aforementioned drawbacks by presenting microwave-annealed IGZO films and methods of making the same.

In accordance with the present disclosure, systems and methods may comprise: (a) depositing an IGZO film onto a substrate; and (b) microwave annealing the IGZO film to produce a microwave-annealed IGZO film.

In accordance with the present disclosure, a system may comprise a microwave-annealed IGZO film disposed atop a substrate. The microwave-annealed IGZO film can include one or more of the following properties: an average optical transmittance that is at least 101% of an average optical transmittance of a conventionally-annealed IGZO film, the average optical transmittance being measured from 300 nm to 800 nm; a maximum optical transmittance that is at least 101% of a maximum optical transmittance of a conventionally-annealed IGZO film, the maximum optical transmittance being measured from 300 nm to 800 nm; and a figure of merit that is at least 101% of a figure of merit of a conventionally-annealed IGZO film, wherein the figure of merit is an average optical transmittance to the tenth power divided by the sheet resistance.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Before the present invention is described in further detail, it is to be understood that the invention is not limited to the particular embodiments described. It is also to be understood that the terminology used herein is for the purpose of describing particular embodiments only, and is not intended to be limiting. The scope of the present invention will be limited only by the claims.

As used herein, the singular forms "a", "an", and "the" include plural embodiments unless the context clearly dictates otherwise.

Specific structures, devices, transistors, and methods relating to microwave-annealed indium gallium zinc oxide (IGZO) films have been disclosed. It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps may be combined with other elements, components, or steps that are not expressly referenced. Embodiments referenced as "comprising" certain elements are also contemplated as "consisting essentially of" and "consisting of" those elements. If a series of numerical ranges are recited, this disclosure contemplates combinations of the lower and upper bounds of those ranges that are not explicitly recited. For example, if a range between 1 and 10 or between 2 and 9 is recited, this disclosure also contemplates a range between 1 and 9 or between 2 and 10.

This disclosure provides methods of making a microwave-annealed indium gallium zinc oxide (IGZO) film. In certain aspects, the methods may comprise one or more of the following steps: (a) depositing an IGZO film onto a substrate; and (b) microwave annealing the IGZO film to produce a microwave-annealed IGZO film.

This disclosure also provides a microwave-annealed IGZO film prepared by the methods described herein.

Depositing an IGZO film onto a substrate can be achieved by methods known to a person having ordinary skill in the art, including but not limited to, sputtering, chemical vapor deposition, and the like.

The systems and methods described herein can be improved in one or more ways relative to systems and methods that deploy conventional annealing processes. As used herein, conventional annealing refers to annealing that utilizes furnace systems. When comparing the systems and methods described herein to systems and methods deploying conventional annealing, the comparison is made between substantially similar systems and methods. For example, a microwave-annealed IGZO film having a particular thickness should be compared with a conventionally-annealed IGZO film having the same thickness.

The systems and methods described herein allow for an annealing time that is reduced from a conventional annealing time. In certain aspects, the microwave annealing can be performed for a length of time of less than 1 hour, including but not limited to, a length of time of less than 55 minutes, less than 50 minutes, less than 45 minutes, less than 40 minutes, less than 35 minutes, less than 30 minutes, less than 25 minutes, less than 20 minutes, less than 15 minutes, less than 10 minutes, less than 9 minutes, less than 8 minutes, less than 7 minutes, less than 6 minutes, or less than 5 minutes.

The systems and methods described herein involve the formation of IGZO thin films that have improved properties using a microwave annealing step that is performed at a temperature that is lower than conventional annealing temperatures.

The systems and methods described herein can include a microwave annealing step in an atmosphere that provides improved properties for the resulting microwave-annealed IGZO film. In certain aspects, the microwave annealing step can be performed in an atmosphere that does not annihilate vacancies in the IGZO film. In certain aspects, the microwave annealing step can be performed in the absence of oxygen. In certain aspects, the microwave annealing step can be performed in a forming gas or a vacuum. In certain aspects, the microwave annealing step can be performed in an inert gas, such as nitrogen, argon, and the like.

In certain aspects, the microwave annealing step can be performed at a temperature of less than 500° C.

In certain aspects, the IGZO films or the microwave-annealed IGZO films can have a thickness ranging from 1 nm to 1 µm, including but not limited to, a thickness ranging from 5 nm to 750 nm, from 25 nm to 500 nm, from 50 nm to 250 nm, or from 75 nm to 100 nm.

The microwave-annealed IGZO films disclosed herein can have improved resistivity properties compared with the IGZO films prior to microwave annealing or compared with conventionally-annealed IGZO films. The microwave-annealed IGZO films can have similar resistivity properties compared with conventionally-annealed IGZO films, but achieved by a process that is faster and utilizes lower temperatures.

In certain aspects, the microwave-annealed IGZO films described herein can have a resistivity of less than $5.0 \times 10^{-5}$ ohm-cm.

In certain aspects, the microwave-annealed IGZO films described herein can have a sheet resistivity of less than 750 ohms per square.

The microwave-annealed IGZO films disclosed herein can have improved optical transmission properties compared with the IGZO films prior to microwave annealing or compared with conventionally-annealed IGZO films.

In certain aspects, the microwave-annealed IGZO films described herein can have an average optical transmittance of at least 101% of an average optical transmittance of the IGZO film or of a conventionally-annealed IGZO film, including but not limited to, an average optical transmittance of at least 102%, at least 103%, at least 104%, at least 105%, at least 110%, at least 115%, at least 120%, at least 130%, at least 140%, at least 150%, at least 175%, or at least 200% of an average optical transmittance of the IGZO film or of a conventionally-annealed IGZO film. The average optical transmittance can be measured from 300 nm to 800 nm.

In certain aspects, the microwave-annealed IGZO films described herein can have a maximum optical transmittance of at least 101% of a maximum optical transmittance of the IGZO film or of a conventionally-annealed IGZO film, including but not limited to, a maximum optical transmittance of at least 102%, at least 103%, at least 104%, at least 105%, at least 110%, at least 115%, at least 120%, at least 130%, at least 140%, at least 150%, at least 175%, or at least 200% of a maximum optical transmittance of the IGZO film or of a conventionally-annealed IGZO film. The maximum optical transmittance can be measured from 300 nm to 800 nm.

A figure of merit (FOM), $\phi_{TC}$, (as defined by Haacke, J. Appl. Phys. 47, 4086 (1976)) can be estimated to determine the performance of the IGZO thin films using the following relationship:

$$\varphi_{TC} = \frac{T_{av}^{10}}{R_{sh}} \quad (1)$$

where, $T_{av}$ is the average transmittance and $R_{sh}$ is the sheet resistance.

The microwave-annealed IGZO films disclosed herein can have an improved FOM compared with the IGZO films prior to microwave annealing or compared with conventionally-annealed IGZO films.

In certain aspects, the microwave-annealed IGZO films described herein can have an FOM of at least 101% of a maximum optical transmittance of the IGZO film or of a conventionally-annealed IGZO film, including but not limited to, an FOM of at least 102%, at least 103%, at least 104%, at least 105%, at least 110%, at least 115%, at least 120%, at least 130%, at least 140%, at least 150%, at least 175%, or at least 200% of an FOM of the IGZO film or of a conventionally-annealed IGZO film. The FOM can be measured from 300 nm to 800 nm.

Example 1

Amorphous IGZO of 100 nm thickness were deposited onto glass substrates by sputtering at room temperature. The films were subsequently annealed in air, vacuum, forming gas and $O_2$ environments by both conventional and microwave methods. The optical and electrical properties of the as-deposited and annealed samples were measured and compared. It was seen that microwave annealing had a dual advantage of reduced time and lower temperature compared to conventional annealing. The optical and electrical properties of the IGZO thin films were measured UV-Visible spectrophotometry, Hall measurement and four point probe analyses. Microwave anneals of 4 minutes at 200° C., the resistivity of IGZO thin films was lowered to $4.45 \times 10^{-3}$ ohm-cm and $4.24 \times 10^{-3}$ ohm-cm in vacuum and forming gas, respectively. However in conventional annealing at 400° C., it took 24 hours to reach $4.5 \times 10^{-3}$ ohm-cm and $4.2 \times 10^{-3}$ ohm-cm in vacuum and forming gas, respectively. The average transmittance of IGZO improved from 80% to almost 86% for microwave annealing.

The IGZO thin films were sputter deposited at room temperature onto a glass substrate in a RF magnetron sputter deposition system. A sputter ceramic target of pure IGZO (99.999% purity, 5.08 cm diameter and 0.64 cm thickness) was used for the oxide layer. The glass substrate was ultrasonically cleaned in isopropanol and acetone and subsequently dried before deposition.

The sputtering was performed in pure argon atmosphere (99.999%) at a pressure of 10 mTorr RF power of 100 W for IGZO without any vacuum break. The thickness of the IGZO thin films was approximately 100 nm as measured by optical ellipsometry. Hall measurements were done using an Ecopia HMS3000 tool by means of the Van der Pauw method. A magnetic field of 0.98 T was applied perpendicular to the sample surface. Four-point-probe technique was used for sheet resistance measurements. Optical transmittance of the multilayers were measured using an Ocean Optics double channel UV-Vis spectrometer (model DS200) in the wavelength range of 300-800 nm with air reference for transmittance.

The films were subsequently annealed by conventional methods in air, forming gas ($H_2/N_2$), oxygen and vacuum at different temperatures for 24 hours. A microwave oven was used for the microwave annealing. The system used single frequency 2.45 GHz microwaves generated by a 1200 W magnetron source. The IGZO samples were encapsulated in a quartz tube filled with different gas environments during the microwave anneals.

A systematic investigation was done in order to determine the effect of anneal parameters on the electrical and optical properties of IGZO thin films in different environments. Hall measurements and four point probe data showed that the electrical resistivity and sheet resistance of the 100 nm thick un-annealed IGZO thin film is $5.5 \times 10^{-3}$ $\Omega$-cm and 1047 $\Omega$/sq, respectively. The films were subsequently annealed in air, forming gas ($H_2/N_2$), oxygen and vacuum at different temperatures for 24 hours and the results are summarized in the following Table 1.

TABLE 1

| Temperature | Resistivity $10^{-3}$ (ohm-cm) | | | | Sheet Resistance (ohm/sq) | | | |
|---|---|---|---|---|---|---|---|---|
| (° C.) | Vacuum | Forming | Air | $O_2$ | Vacuum | Forming | Air | $O_2$ |
| 25 | 5.5 | 5.5 | 5.5 | 5.5 | 1047 | 1047 | 1047 | 1047 |
| 100 | 5.3 | 5.1 | 5.4 | 6.3 | 976 | 914 | 1007 | 1174 |
| 200 | 4.9 | 4.7 | 5.5 | 6.8 | 922 | 837 | 1092 | 1252 |
| 300 | 4.7 | 4.4 | 5.6 | 6.95 | 794 | 616 | 1173 | 1315 |
| 400 | 4.5 | 4.2 | 6.1 | 7.9 | 657 | 532 | 1296 | 1376 |
| 500 | 5.8 | 5.6 | 6.4 | 8.4 | 1023 | 1015 | 1472 | 1739 |

From the above Table 1, it can be concluded that the IGZO films showed superior electrical properties on annealing in vacuum and forming gas. However, they exhibit inferior electrical behavior in air and $O_2$. In case of forming gas and vacuum, both the resistivity and sheet resistance data decreased gradually with the increase in annealing temperature from room temperature to 400° C. but showed a sharp increase at 500° C. The possible reason can be the damage of the IGZO thin films at such a high temperature. A similar comparative table (Table 2) for microwave annealing of the same IGZO samples in different annealing environments.

Figure 1:
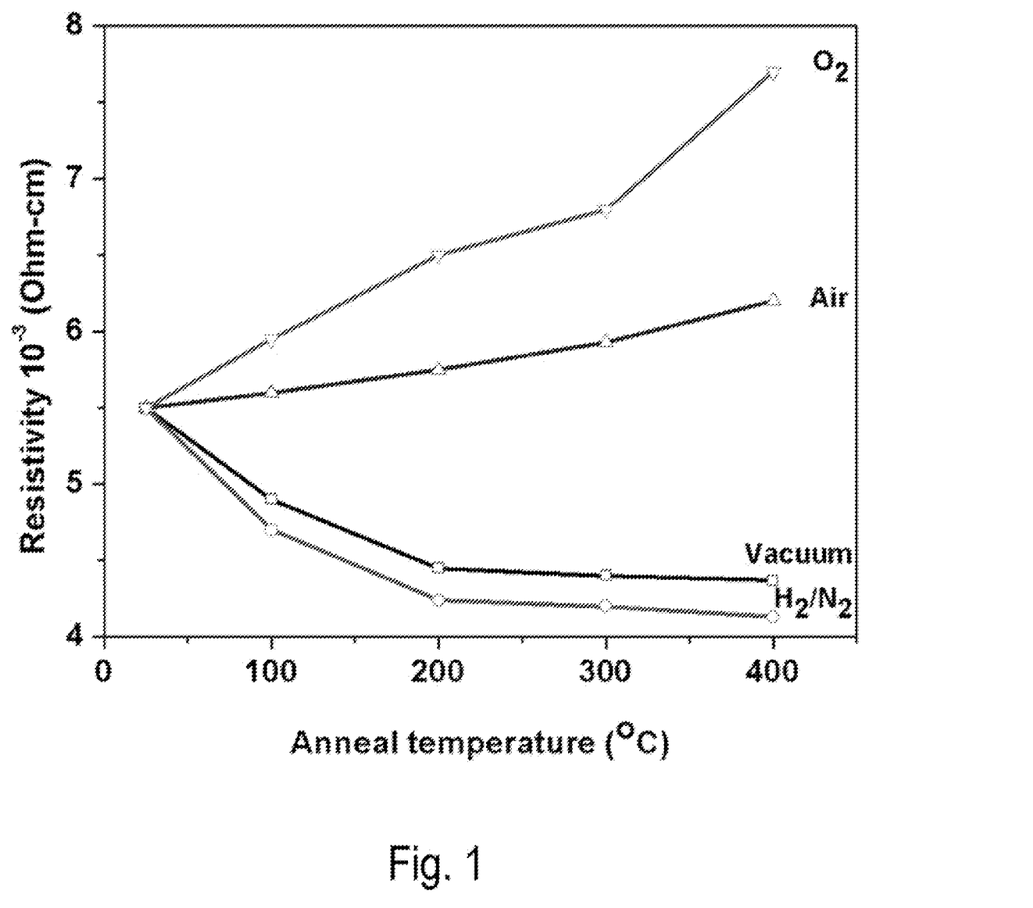
FIG. 1 is a plot of the resistivity of microwave annealed IGZO thin films in different ambient.

FIG. 1 shows a graphical representation of the effect of microwave annealing of IGZO thin films in different ambients as shown in Table 2. The plot clearly suggests that with the increase in annealing temperature, the resistivity gradually decrease in vacuum and forming gas. However, the opposite trend is seen in case of air and $O_2$ atmosphere. The result can explained by the fact that annealing in vacuum and forming gas creates more vacancies and thus improves the conductivity of the thin films; whereas in case of air and $O_2$, vacancies are annihilated.

TABLE 2

| Temperature | Time to reach the desired temp | Resistivity $10^{-3}$ (ohm-cm) | | | | Sheet Resistance (ohm/sq) | | | |
|---|---|---|---|---|---|---|---|---|---|
| (° C.) | (mins) | Vacuum | Forming | Air | $O_2$ | Vacuum | Forming | Air | $O_2$ |
| 25 | 0 | 5.5 | 5.5 | 5.5 | 5.5 | 1047 | 1047 | 1047 | 1047 |
| 100 | 2.5 | 4.9 | 4.7 | 5.6 | 5.95 | 877 | 843 | 1025 | 1290 |
| 200 | 4 | 4.45 | 4.24 | 5.75 | 6.5 | 661 | 537 | 1134 | 1376 |

TABLE 2-continued

| Temperature | Time to reach the desired temp | Resistivity 10⁻³ (ohm-cm) | | | | Sheet Resistance (ohm/sq) | | | |
|---|---|---|---|---|---|---|---|---|---|
| (° C.) | (mins) | Vacuum | Forming | Air | O$_2$ | Vacuum | Forming | Air | O$_2$ |
| 300 | 5.65 | 4.4 | 4.2 | 5.93 | 6.8 | 658 | 522 | 1216 | 1454 |
| 400 | 7 | 4.37 | 4.13 | 6.2 | 7.7 | 653 | 526 | 1315 | 1517 |
| 500 | 8 | 5.55 | 5.4 | 6.5 | 8.7 | 944 | 916 | 1532 | 1790 |

Figure 2A:
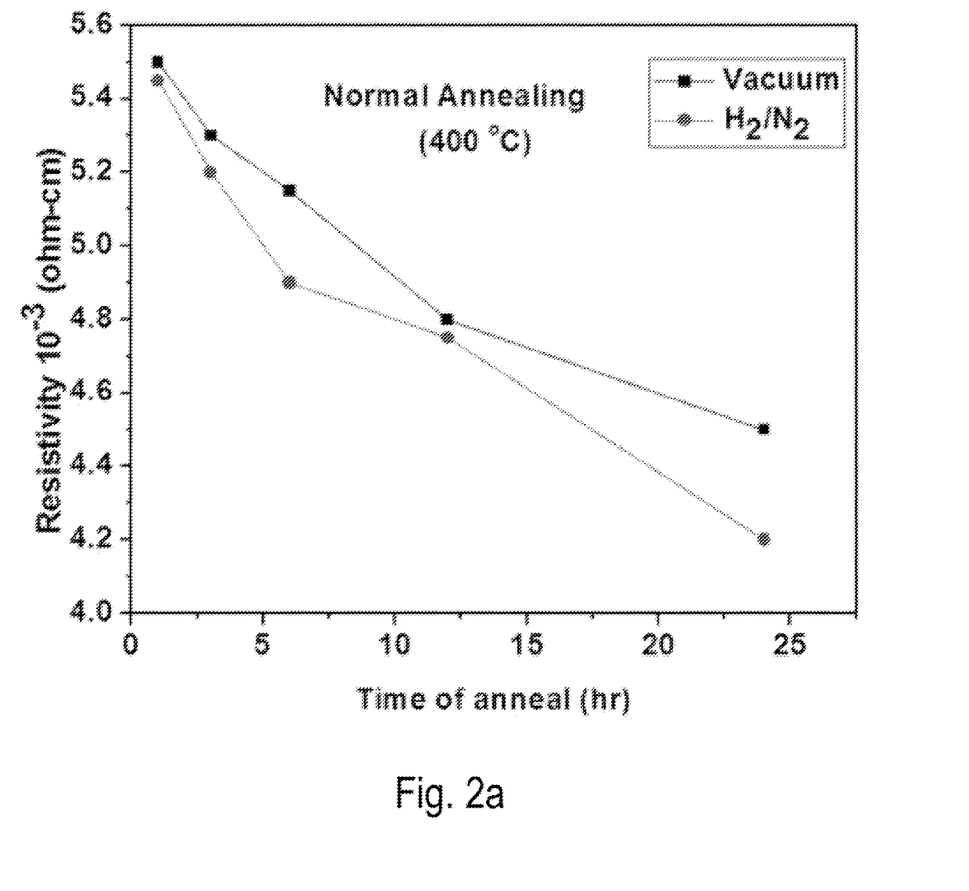
FIG. 2a shows a plot of resistivity versus annealing time for a conventionally-annealed IGZO film in a vacuum and forming gas atmosphere.
Figure 2B:
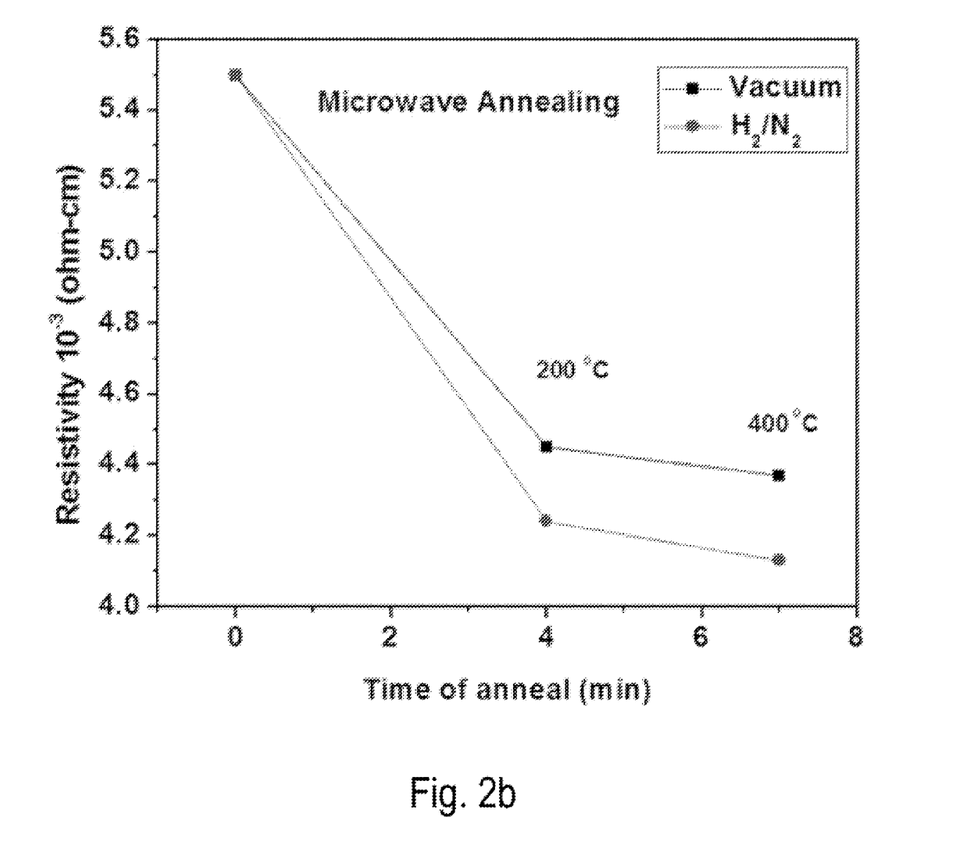
FIG. 2b shows a plot of resistivity versus annealing time for a microwave-annealed IGZO film in a vacuum and forming gas atmosphere.

FIGS. 2a and 2b shows the comparative plots of resistivity versus annealing time by conventional and microwave annealing, respectively. The IGZO films are annealed only in vacuum and forming gas (H$_2$/N$_2$) as these two environment showed superior electrical properties (Table 1). While both anneals show a steady decrease in resistivity, the advantage with the microwave anneal is the lower temperature and a much reduced time. Due to the volumetric heating of the microwave, it is possible to attain 200° C. and 400° C. in just 4 and 7 minutes, respectively. Also, in 4 minutes at 200° C., the resistivity of IGZO thin films after microwave annealing was lowered to 4.45 and 4.24×10⁻³ ohm-cm in vacuum and forming gas, respectively. However in conventional annealing at 400° C., it took 24 hours to reach 4.5 and 4.2×10⁻³ ohm-cm in vacuum and forming gas, respectively. Also, in microwave annealing at 400° C., the resistivity was further lowered to 4.4 and 4.1×10⁻³ ohm-cm in vacuum and forming gas, respectively. Thus there is a dual advantage with microwave annealing in terms of both low temperature and reduced time.

Figure 3A:
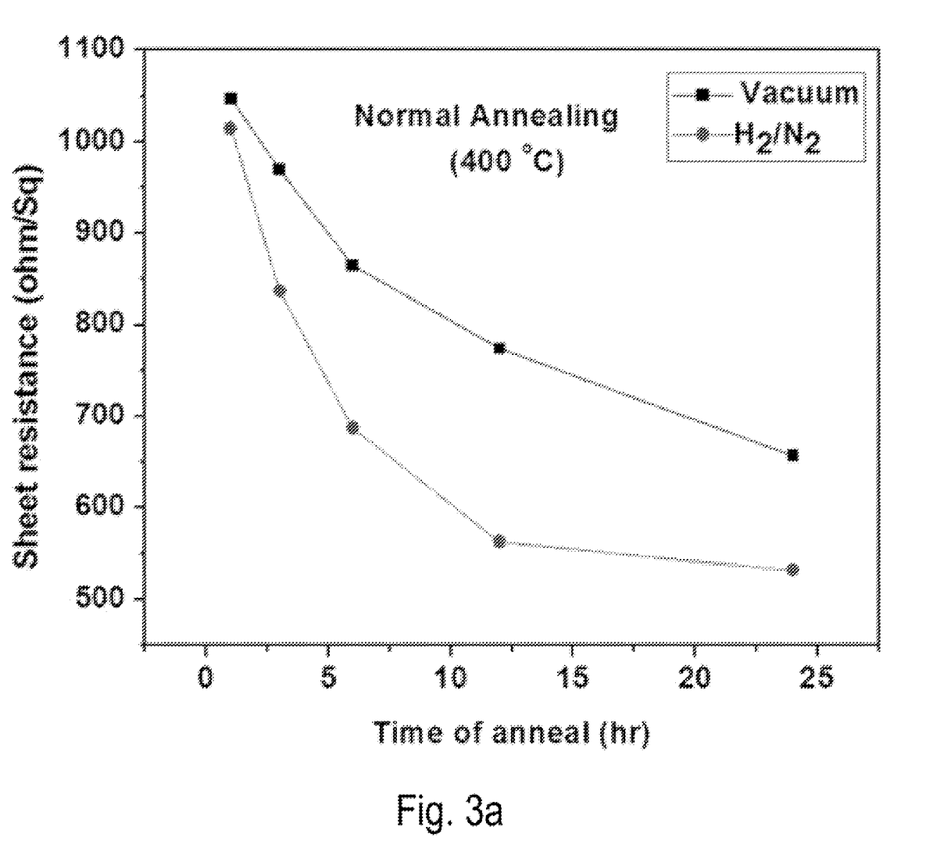
FIG. 3a shows a plot of sheet resistance versus annealing time for a conventionally-annealed IGZO film in a vacuum and forming gas atmosphere.
Figure 3B:
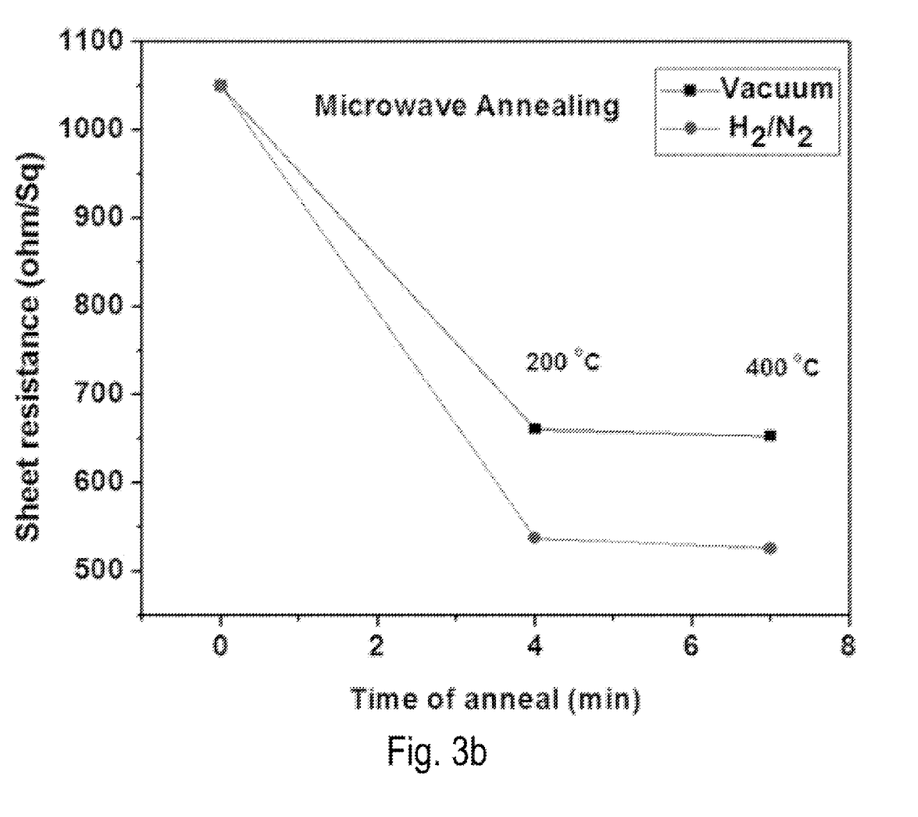
FIG. 3b shows a plot of sheet resistance versus annealing time for a microwave-annealed IGZO film in a vacuum and forming gas atmosphere.

FIGS. 3a and 3b the comparative plots of resistivity versus annealing time by conventional and microwave annealing, respectively. A similar trend was observed in the sheet resistivity as was observed in the resistivity. Here, the sheet resistance is lowered from 1047 ohm/sq to 661 ohm/sq and 537 ohm/sq in vacuum and forming gas, respectively, in 4 minutes at 200° C.

Figure 4A:
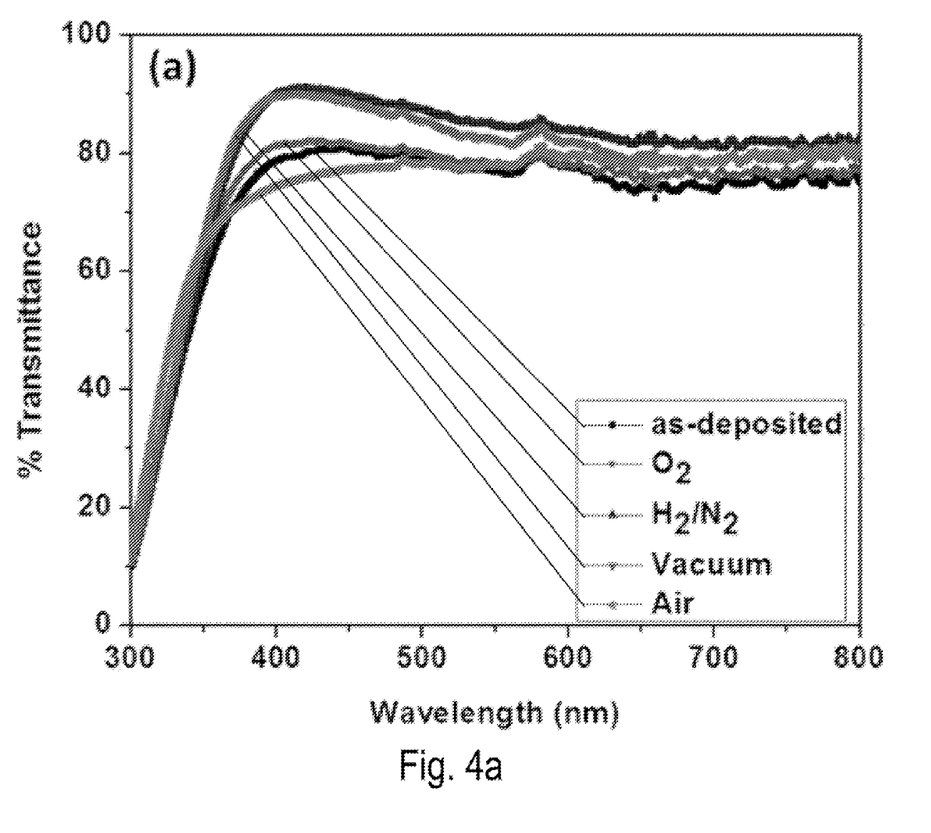
FIG. 4a shows optical transmittance spectra of as-deposited IGZO films and IGZO films microwave-annealed to 400° C. in different atmospheres.
Figure 4B:
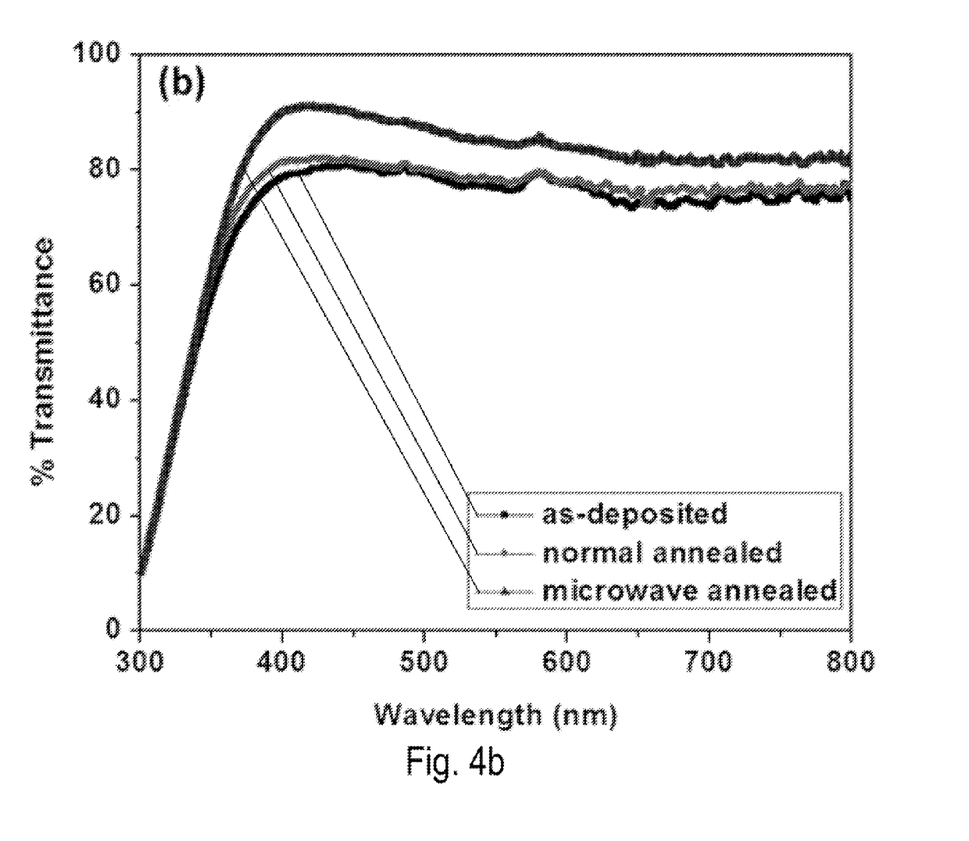
FIG. 4b shows optical transmittance spectra of as-deposited, conventionally-annealed, and microwave-annealed IGZO films.

FIGS. 4a and 4b show optical transmittance spectra for the as-deposited and annealed IGZO thin films on glass substrate. FIG. 4a shows an improvement in optical transmittance when annealed in vacuum and forming gas but no significant change was observed on annealing in air and O$_2$. The optical spectra clearly suggest a significant improvement in optical transmittance for the microwave anneal when compared to a conventional anneal. The optical transmittance of IGZO improves from 80% to almost 86% for the microwave anneal in FIG. 4b.

The IGZO thin films formed by microwave annealing showed an improved FOM when compared to the normal anneal. Table 1 and FIGS. 4a, and 4b suggest an improvement in both optical and electrical properties of the IGZO thin films when annealed in vacuum and forming gas, respectively; and thus improving the FOM. However in air and O$_2$ ambients, the FOM decreased due to a decrease in sheet resistance with no significant improvement in the optical transmittance.

We claim:
1. A method comprising:
  (a) depositing an indium gallium zinc oxide (IGZO) film onto a substrate; and
  (b) microwave annealing the IGZO film to produce a microwave-annealed IGZO film,
  wherein the microwave-annealed IGZO film has one or more of the following properties:
    an average optical transmittance that is at least 101% of an average optical transmittance of the IGZO film or a conventionally-annealed IGZO film, the average optical transmittance being measured from 300 nm to 800 nm,
    a maximum optical transmittance that is at least 101% of a maximum optical transmittance of the IGZO film or the conventionally-annealed IGZO film, the maximum optical transmittance being measured from 300 nm to 800 nm, and
    a figure of merit that is at least 101% of a figure of merit of the IGZO film or the conventionally-annealed IGZO film, the figure of merit is the average optical transmittance to the tenth power divided by a sheet resistance.

2. The method of claim 1, wherein the microwave annealing is performed for a length of time of less than 1 hour.

3. The method of claim 1, wherein the microwave annealing is performed at a temperature of less than 500° C.

4. The method of claim 1, wherein the microwave annealing is performed in an atmosphere that does not annihilate vacancies in the IGZO film.

5. The method of claim 1, wherein the microwave annealing is performed in an absence of oxygen.

6. The method of claim 1, wherein the microwave annealing is performed in a forming gas or a vacuum.

7. The method of claim 1, wherein the IGZO film has a thickness of 1 nm to 1 μm.

8. The method of claim 1, wherein the average optical transmittance of the microwave-annealed IGZO film is at least 101% of the average optical transmittance of the IGZO film or a conventionally-annealed IGZO film, or
  wherein the maximum optical transmittance of the microwave-annealed IGZO film is at least 101% of the maximum optical transmittance of the IGZO film or the conventionally-annealed IGZO film.

9. The method of claim 1, wherein the figure of merit of the microwave-annealed IGZO film is at least 101% of the figure of merit of the IGZO film or the conventionally-annealed IGZO film.

10. A microwave-annealed indium gallium zinc oxide (IGZO) film, wherein the microwave-annealed IGZO film is formed by depositing an IGZO film onto a substrate and microwave annealing the IGZO film to produce the microwave-annealed IGZO film,
  wherein the microwave-annealed IGZO film has one or more of the following properties:
    an average optical transmittance that is at least 101% of an average optical transmittance of a conventionally-annealed IGZO film, the average optical transmittance being measured from 300 nm to 800 nm,
    a maximum optical transmittance that is at least 101% of a maximum optical transmittance of the conventionally-annealed IGZO film, the maximum optical transmittance being measured from 300 nm to 800 nm, and a figure of merit that is at least 101% of a figure of merit of the conventionally-annealed IGZO film, the figure of merit is the average optical transmittance to the tenth power divided by a sheet resistance.

11. The microwave-annealed IGZO of claim 10, wherein the microwave annealing is performed for a length of time of less than 1 hour.

12. The microwave-annealed IGZO of claim 10, wherein the microwave annealing is performed at a temperature of less than 500° C.

13. The microwave-annealed IGZO of claim 10, wherein the microwave-annealed IGZO film has a resistivity of less than $5.0 \times 10^{-5}$ ohm-cm.

14. The microwave-annealed IGZO film of claim 10, wherein the microwave-annealed IGZO film has a sheet resistivity of less than 750 ohms per square.

15. The microwave-annealed IGZO film of claim 10, wherein the microwave-annealed IGZO film has a thickness of 1 nm to 1 µm.

16. The microwave-annealed IGZO film of claim 10, wherein the average optical transmittance of the microwave-annealed IGZO film is at least 101% of the average optical transmittance of the conventionally-annealed IGZO film.

17. The microwave-annealed IGZO film of claim 10, wherein the maximum optical transmittance of the microwave-annealed IGZO film is at least 101% of the maximum optical transmittance of the conventionally-annealed IGZO film, the maximum optical transmittance being measured from 300 nm to 800 nm.

18. The microwave-annealed IGZO film of claim 10, wherein the figure of merit of the microwave-annealed IGZO film is at least 101% of the figure of merit of the conventionally-annealed IGZO film.

19. A system comprising microwave-annealed indium gallium zinc oxide (IGZO) film disposed atop a substrate, the microwave-annealed IGZO film having one or more of the following properties:

an average optical transmittance that is at least 101% of an average optical transmittance of a conventionally-annealed IGZO film, the average optical transmittance being measured from 300 nm to 800 nm;

a maximum optical transmittance that is at least 101% of a maximum optical transmittance of the conventionally-annealed IGZO film, the maximum optical transmittance being measured from 300 nm to 800 nm; and a figure of merit that is at least 101% of a figure of merit of the conventionally-annealed IGZO film, wherein the figure of merit is the average optical transmittance to the tenth power divided by a sheet resistance.

20. The system of claim 19, wherein the microwave-annealed IGZO film has a thickness of 1 nm to 1 µm.

* * * * *